(12) United States Patent
Henderson

(10) Patent No.: US 6,951,288 B2
(45) Date of Patent: Oct. 4, 2005

(54) EARTHQUAKE RESISTANT EQUIPMENT RACK

(75) Inventor: Kevin R. Henderson, Wooster, OH (US)

(73) Assignee: L&P Property Management Company, South Gate, CA (US)

( * ) Notice: Subject to any disclaimer, the term of this patent is extended or adjusted under 35 U.S.C. 154(b) by 193 days.

(21) Appl. No.: 10/432,308

(22) PCT Filed: Nov. 30, 2001

(86) PCT No.: PCT/US01/45176

§ 371 (c)(1),
(2), (4) Date: May 21, 2003

(87) PCT Pub. No.: WO02/45225

PCT Pub. Date: Jun. 6, 2002

(65) Prior Publication Data

US 2004/0020873 A1 Feb. 5, 2004

Related U.S. Application Data

(60) Provisional application No. 60/250,262, filed on Nov. 30, 2000.

(51) Int. Cl.[7] .................................................. A47F 5/00
(52) U.S. Cl. ...................... 211/26; 312/265.4; 361/829; 52/167.1
(58) Field of Search ................ 211/26, 189; 312/265.1, 312/265.4; 361/829; 52/167.1

(56) References Cited

U.S. PATENT DOCUMENTS

| | | | |
|---|---|---|---|
| 1,957,362 A | 5/1934 | Smith | |
| 3,789,174 A | 1/1974 | Barkan et al. | |
| 4,497,411 A | 2/1985 | DeBortoli | |
| 4,553,674 A | 11/1985 | Yoshikawa et al. | |
| 4,715,502 A | 12/1987 | Salmon | |
| 4,899,892 A | * 2/1990 | Rheault | 211/26 |
| 5,004,107 A | * 4/1991 | Sevier et al. | 211/26 |
| 5,233,129 A | 8/1993 | Hall | |
| 5,250,752 A | 10/1993 | Cutright | |
| 5,284,254 A | 2/1994 | Rinderer | |
| 5,310,156 A | 5/1994 | Matsumura et al. | |
| 5,323,916 A | * 6/1994 | Salmon | 211/26 |
| 5,363,613 A | 11/1994 | Sevier | |
| 5,383,723 A | 1/1995 | Meyer | |
| 5,513,729 A | 5/1996 | Besserer et al. | |
| 5,540,339 A | 7/1996 | Lerman | |
| 5,566,836 A | 10/1996 | Lerman | |
| 5,574,251 A | 11/1996 | Sevier | |
| 5,584,406 A | 12/1996 | Besserer et al. | |
| 5,683,001 A | 11/1997 | Masuda et al. | |
| 5,819,956 A | 10/1998 | Rinderer | |
| 5,934,485 A | * 8/1999 | Harris et al. | 211/26 |
| 5,975,315 A | 11/1999 | Jordan | |
| 5,979,672 A | 11/1999 | Gemra et al. | |
| 5,983,582 A | 11/1999 | Vugrek | |
| 5,983,590 A | 11/1999 | Serban | |
| 6,006,925 A | * 12/1999 | Sevier | 211/26 |
| 6,170,673 B1 | 1/2001 | Nicolai | |
| 6,179,133 B1 | 1/2001 | Reece | |
| D438,177 S | 2/2001 | Rogers | |
| 6,202,860 B1 | 3/2001 | Ludwig | |
| 6,321,917 B1 | * 11/2001 | Mendoza | 211/26 |
| 6,349,837 B1 | * 2/2002 | Serban | 211/26 |

* cited by examiner

Primary Examiner—Robert W. Gibson, Jr.
(74) Attorney, Agent, or Firm—Hahn Loeser & Parks, LLP

(57) ABSTRACT

An earthquake resistant equipment rack that includes multiple methods for reinforcing the equipment rack to resist seismic forces. The side rails can include two inwardly projecting V portions extending the length of the rails to diffuse seismic forces by deflecting seismic forces vertically. The base and top are preferably formed from multiple components formed from sheet metal and having both over-lapping multiple thickness of sheet metal and multiple box structures. A cover is non-removably attached to the base. In one embodiment, the cover has a dog house shape with inclined roof like surfaces.

83 Claims, 17 Drawing Sheets

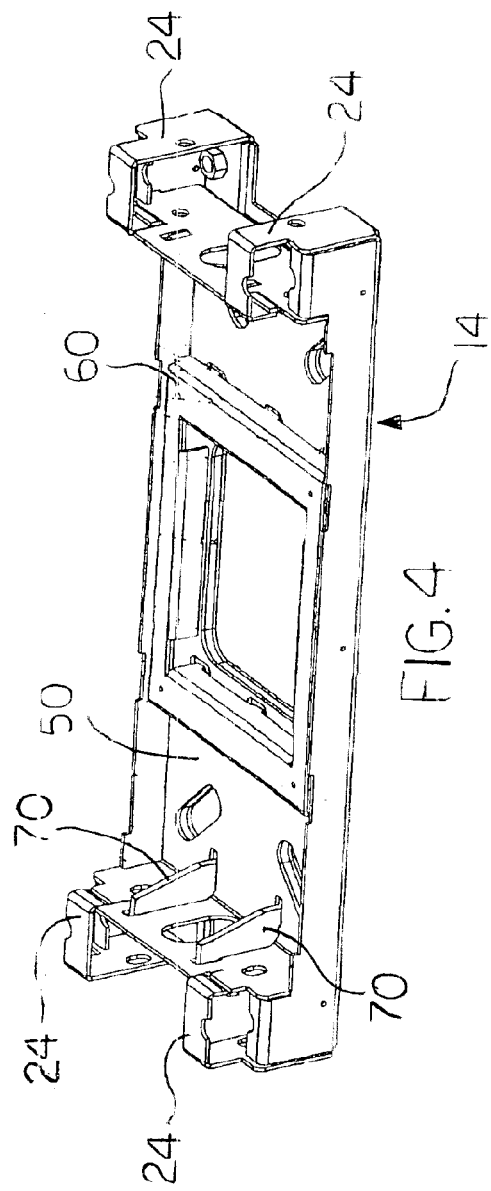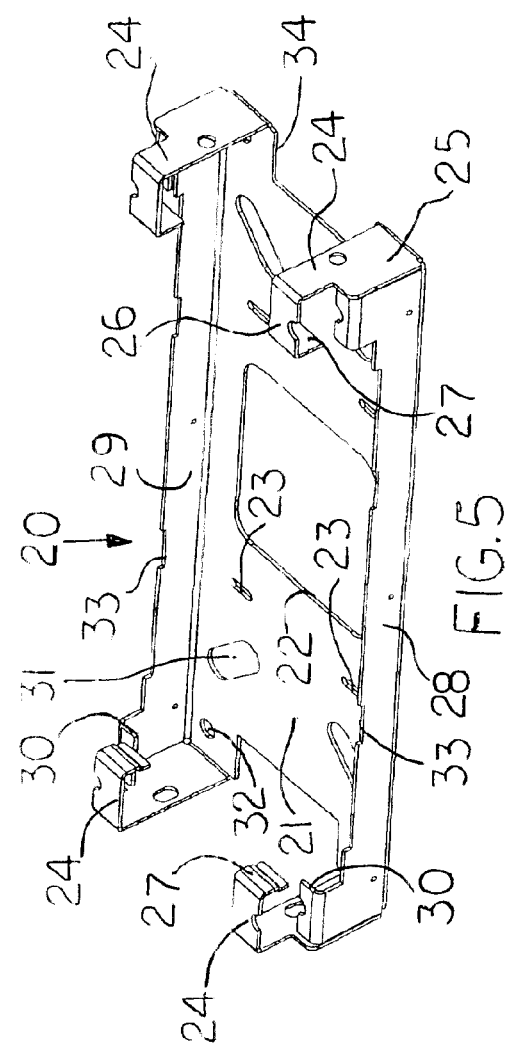

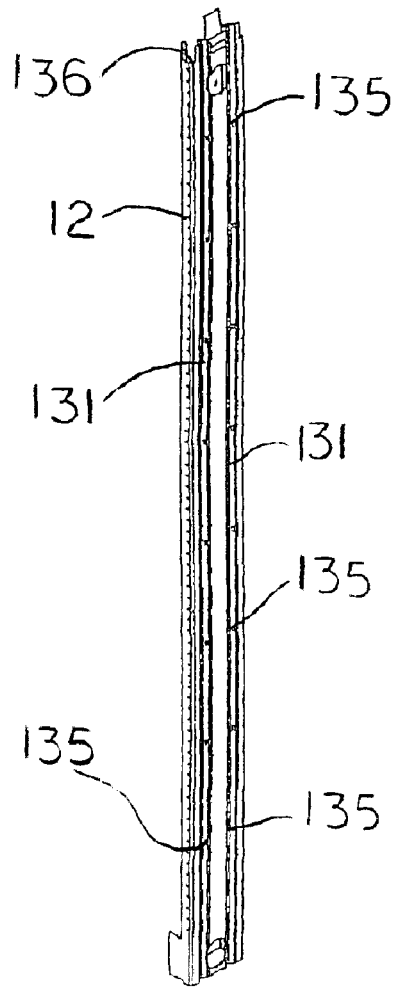
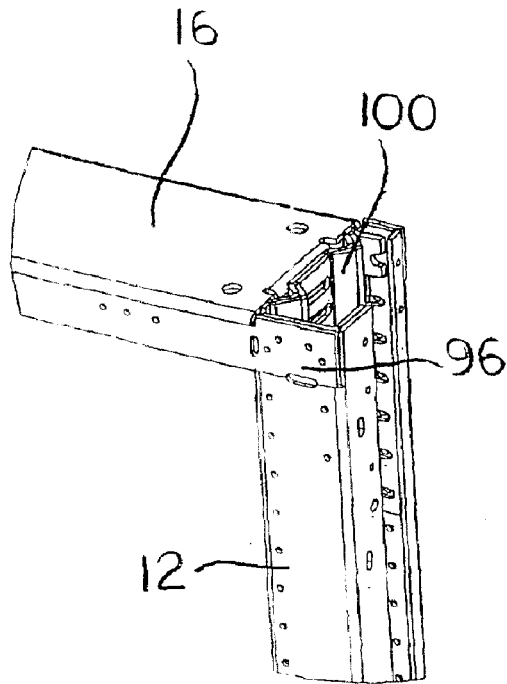
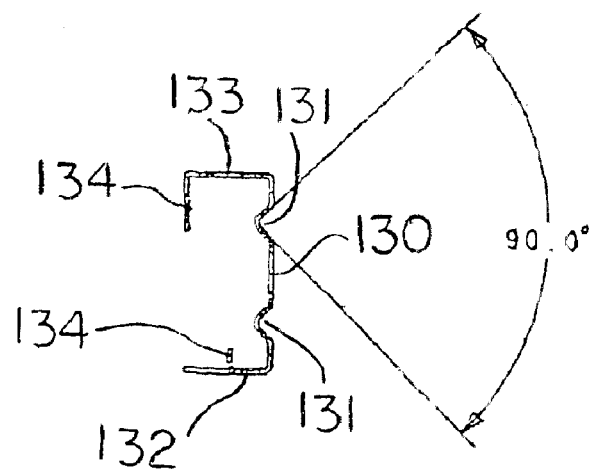

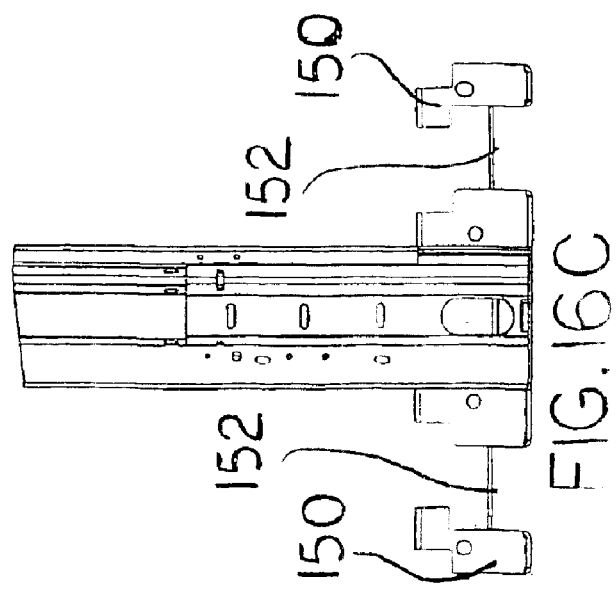
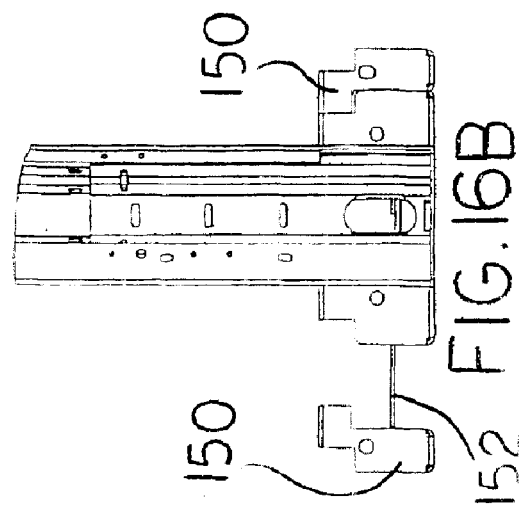
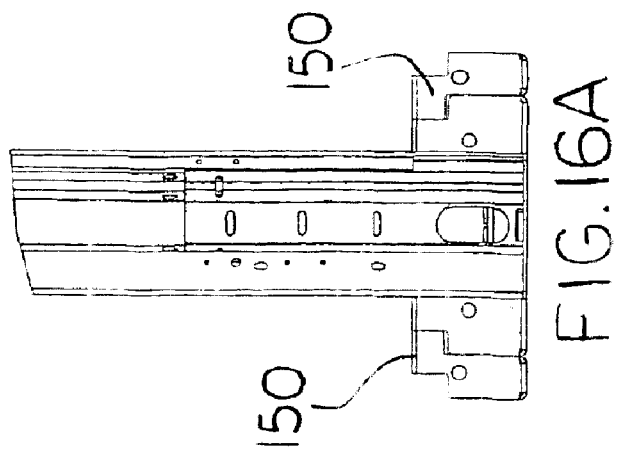

EARTHQUAKE RESISTANT EQUIPMENT RACK

This application claims the benefit of U.S. provisional application Ser. No. 60/250,262, filed Nov. 30, 2000. Application Ser. No. 60/250,262 is hereby incorporated by reference.

TECHNICAL FIELD

The present invention relates generally to racks for electrical equipment and, more particularly, to a rack for electrical equipment that can withstand abnormal seismic activity typical of areas prone to earthquakes and other destructive natural phenomena.

BACKGROUND OF THE INVENTION

Preservation of electronic equipment during earthquakes and after shocks for the maintenance of communications and other purposes is a major concern of earthquake preparedness. As there is a critical need for communications immediately after an earthquake in a populated area, it is important for communications equipment to be able to withstand the most severe earthquakes or seismic shocks that can be expected to occur in the vicinity of such equipment.

With the introduction of electronic and fiber optic telephone switching equipment, the density of calls being handled in one equipment rack or network bay has advanced significantly. Today as many as 20,000 telephone lines could be interrupted with the loss of one bay of equipment. This has made the reliability of telephone switching equipment, communications equipment or other sensitive electronic equipment and its supporting structure critically important. Traditionally earthquake protection has been achieved by providing equipment racks or network bays with relatively massive bracing or using heavier materials, which both add significantly to the labor and cost in manufacturing. In prior configurations, design of equipment racks have utilized different gauge materials to provide desired structural integrity, but results in added cost and problems in assembly.

During seismic motion, the base of a tall, slender, frame moves with the floor to which it is anchored. If the frame is sufficiently rigid and well anchored it will closely follow the motions of the base and floor. If, however, the frame is more flexible, it will move at a rate different to that of the base and floor, and consequently experience high stresses and deflections. To accommodate desired operation in different seismic environments, the equipment rack must provide structural integrity to a desired level balanced with cost and other desired attributes of such an equipment rack. For example, it may be desirable to allow an equipment rack to be used to support various electronic or other equipment, but such equipment requires differing mounting requirements and space. Known equipment racks do not provide modularity or adaptable uses to accommodate differing equipment or environments.

U.S. Pat. No. 4,553,674, Casing Construction for Electronic Equipment, shows an equipment rack with a square wave type shape for the side rails. U.S. Pat. No. 4,899,892, Earthquake-Resistant Electronic Equipment Frame, describes a side rail having an inverted-V extending the length of the side rail to stiffen the side rail. U.S. Pat. No. 5,004,107, Earthquake Braced Racks, describes an electronic equipment that uses a reinforcing gusset, which includes a floor section that partially overlaps the floor of the base. U.S. Pat. No. 5,284,254, Rack for Electrical Equipment, describes an equipment rack that uses a two part removable cover attached to a base. U.S. Pat. No. 5,819,956, Rack for Electrical Equipment, discloses an equipment rack that reinforces the upper portion of the rails with a channel like bracket and reinforces the lower portion of the rails with an L shaped bracket. U.S. Pat. No. 5,979,672, Earthquake Resistant Enclosure for Electronic Equipment, describes an equipment rack where a top rail, bottom rail and side rails are formed using corrugated metal. U.S. Pat. No. 5,983,590, Earthquake Resistant Equipment Rack, shows an equipment rack that uses a base with integrally formed upright walls along with U-shaped gussets reinforcing a rail to top connection and corner gussets welded to the base. U.S. Pat. No. 6,006,925, Equipment Rack System, describes an equipment rack that uses side rails that have a two cycle reflected square wave shape to reinforce the side rails. U.S. Pat. No. 6,202,860, Electronic Equipment Enclosure, shows another equipment that uses corrugated metal for the top rail, bottom rail and side rails.

Therefore, in light of the foregoing deficiencies in the prior art, Applicant's invention is herein presented.

SUMMARY OF THE INVENTION

Accordingly, one object of the present invention is to provide an electronic equipment rack which protects equipment mounted therein from damage due to earthquakes and seismic motion.

It is a related object of the present invention to provide an electronic equipment rack having substantially increased overall strength without using heavier materials which otherwise would increase the racks overall weight and cost.

It is a further object to provide an electronic equipment rack having fewer components and requiring fewer manufacturing steps thereby keeping production costs to a minimum.

An additional object is to provide an electronic equipment rack with increased stiffness at different locations to accommodate required loads and stresses without increasing the desired dimensions and/or weight of the rack.

Generally, the present invention includes several embodiments of an equipment rack, a first comprising a base having unique characteristics to accommodate upstanding midrails at a central portion of the depth of the base. The midrails are in turn coupled to one another by a top frame member in a manner to provide desired structural integrity to particular standards relating to handling seismic energy. The midrail design presents possible problems in properly supporting equipment therein and handling cables or other connections to the supported equipment. In the present invention, the base is comprised of several components which allow proper structural characteristics to be achieved while accommodating cabling or other requirements through the central portion of the base. More particularly, the base may comprise a pair of outer base members which interlock with a base gusset member to form an integral base having a solid bottom with double wall thicknesses provided by the interlocking outer base and base gusset members. A base cover is then secured in position with the outer base and base gusset members in a manner to provide structural integrity from front to back and side to side in the base. The design of the base cover allows access through the base cover for cabling or other requirements. The base cover provides such advantages without interference into the equipment carrying space of the rack. In addition, the equipment rack of this embodiment may comprise a reinforced corner structure in association with the rails and top frame member. Each of the side rails of the equipment frame is formed as a generally U-shaped channel providing an amount of structural integrity. The top corners of the side rails are particularly susceptible to stresses due to seismic activity or vibration, and are preferably reinforced without the use of heavier gauge materials. In this embodiment, a gusset member is designed to mate into position within the U-shaped side rail member to effectively reinforce the corner area with a double wall thickness of material, but using similar gauge material throughout. Further, the gusset member is designed to be positively engaged with the top rail member in conjunction with the side rail members for added stiffening an strength. A tab provided on each end of the top rail member the side rail members as well as reinforcing gusset members for proper positioning and alignment of the components and to allow each to be secured to one another. The top rail member may also be configured to be constructed of top and bottom members of similar gauge material which fit in an interlinking manner to provide desired stiffness and strength characteristics. One of the top or bottom members also may be configured with ears that extend outwardly into adjacent relationship with the reinforcing gusset member at each corner, allowing further securing of the top rail therewith. In this manner, all vertical surfaces of the corner portions in the rack design are double wall thicknesses providing desired structural characteristics. The rack design of this embodiment further may be used in a modular manner, wherein two or more racks can be assembled with one another to provide different size and supporting requirements.

In another embodiment, an equipment rack is designed to combine characteristics of rack requirements as specified by regulatory agencies, such as ETSI and NEBS. In this embodiment, the base of the rack is comprised of several members which when assembled provide a plurality of structural box-like portions which provide desired structural characteristics and simplify manufacture and assembly. A base cover cooperates with other base members to provide a box in box type of design which enhances structural integrity using lighter gauge materials. Side rail members of the rack may be provided with embossed sections to enhance stiffness characteristics. Other unique attributes of the rack design will also become apparent. Also, similar to the first embodiment, the rack design of this embodiment further may be used in a modular manner, wherein two or more racks can be assembled with one another to provide different size and supporting requirements.

The embodiments of the invention improve strength and stiffness at maximum stress positions to increase the racks lateral force tolerance thereby increasing the racks strength in its weakest direction. The coupling positions of components which are subjected to the highest stress levels of any point on the equipment rack are designed to accommodate expected loads and stresses.

The foregoing and other aspects will become apparent from the following detailed description of the invention when considered in conjunction with the accompanying drawing figures.

BRIEF DESCRIPTION OF THE DRAWING FIGURES

FIG. 4 is a perspective view of the base of the equipment rack shown in FIG. 1, without the vertical posts or base cover;

FIG. 5 is a perspective of the outer base of the equipment rack shown in FIG. 1;

FIG. 9 is a perspective view of a preferred embodiment of the vertical post;

FIG. 10 is a top view of the vertical post shown in FIG. 9;

FIG. 11 is a partial perspective view of one upper corner of the equipment rack shown in FIG. 1;

Figure 15:
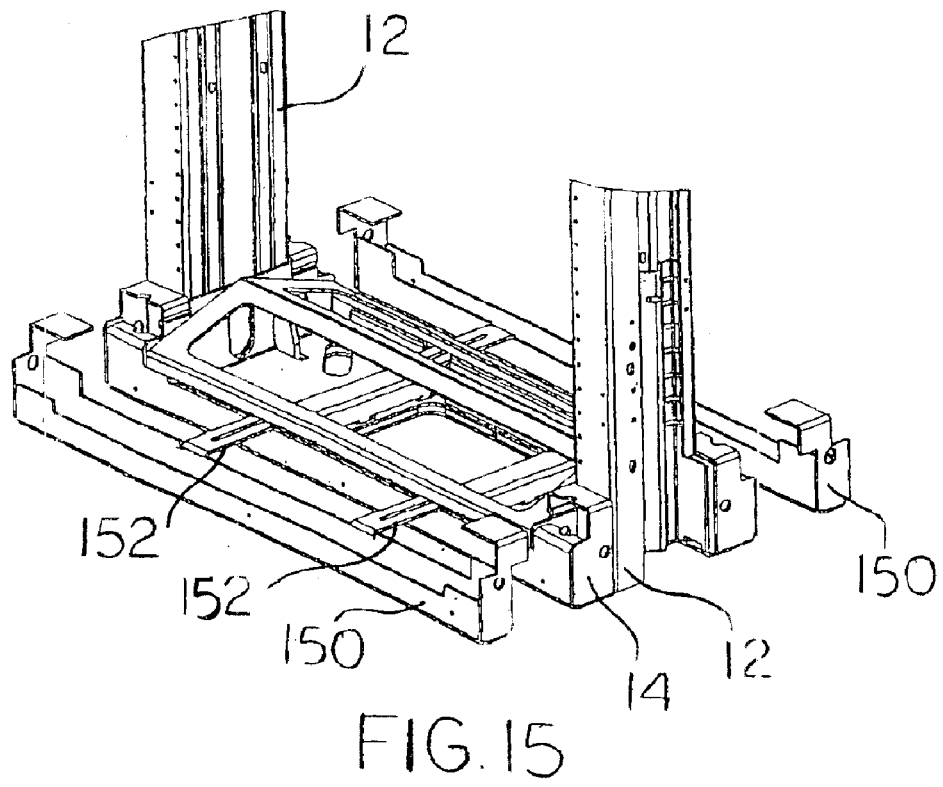
FIG. 15 is partial perspective view of the bottom of the equipment rack shown in FIG. 1 illustrating a base extension.
Figure 17:
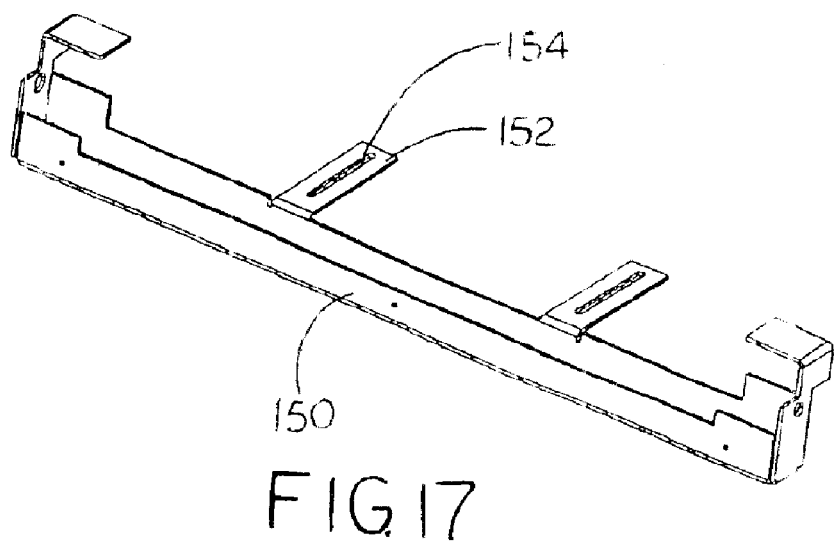
Figure 18:
Figure 19:
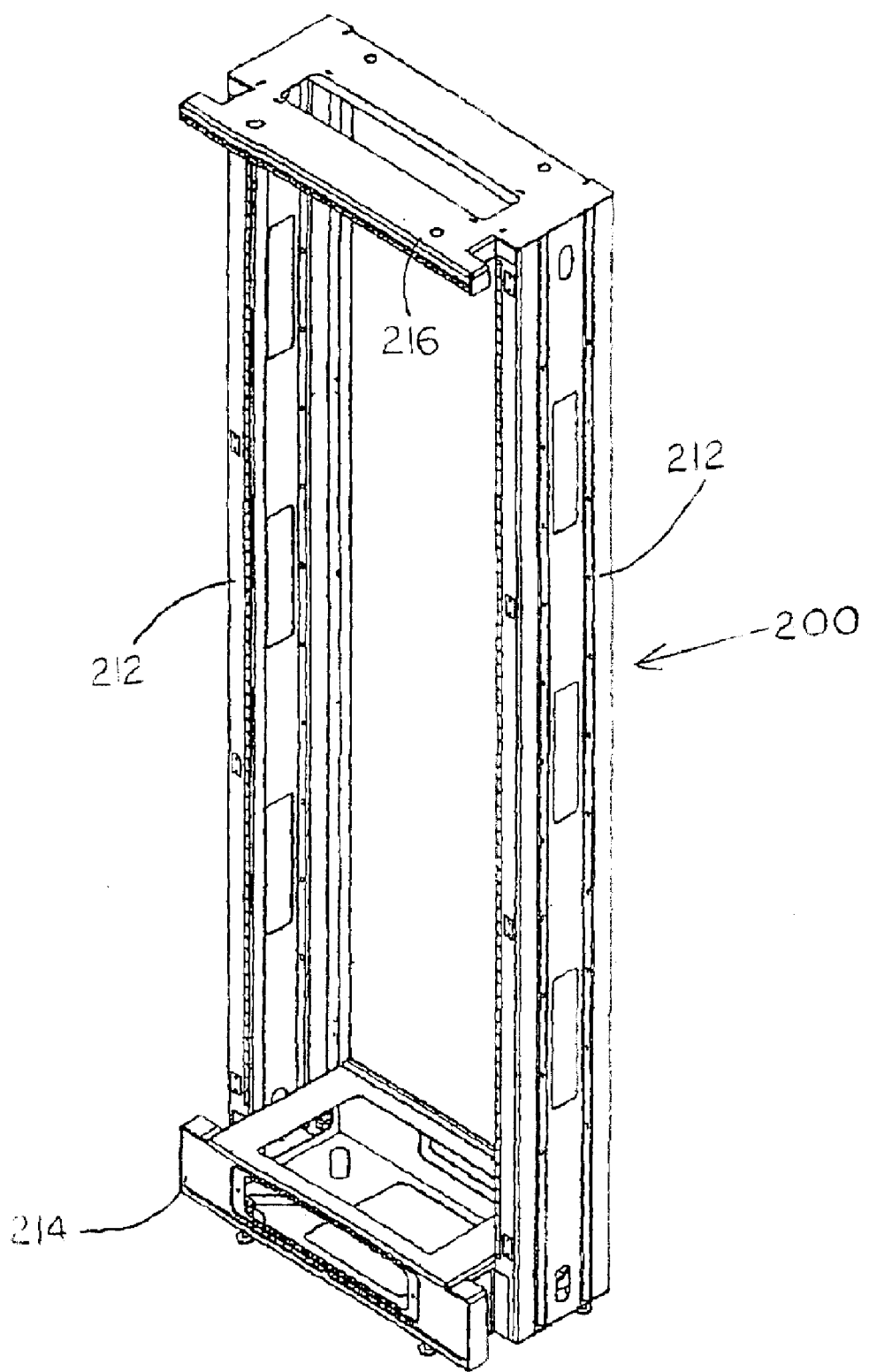
Figure 20:
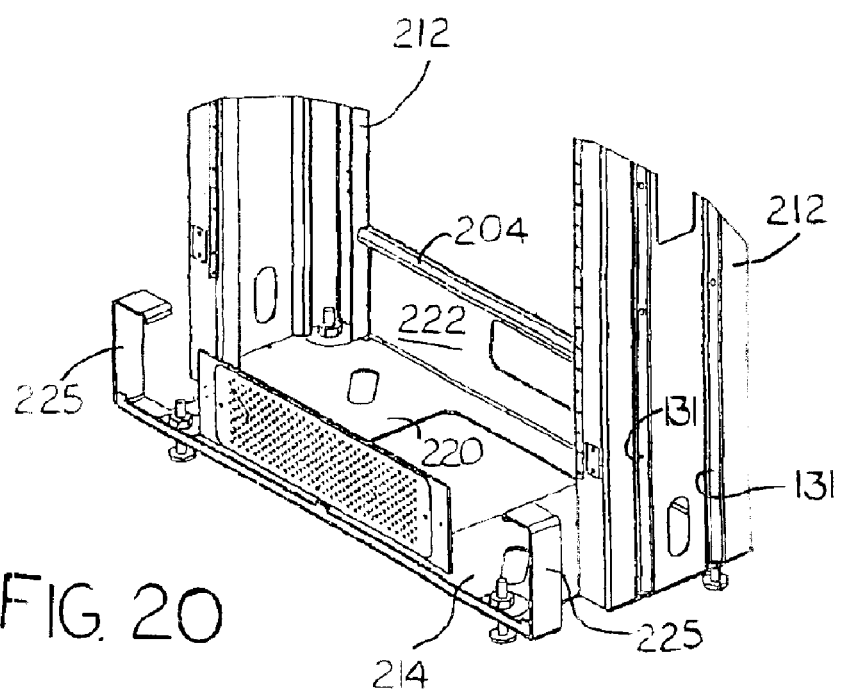
Figure 21:
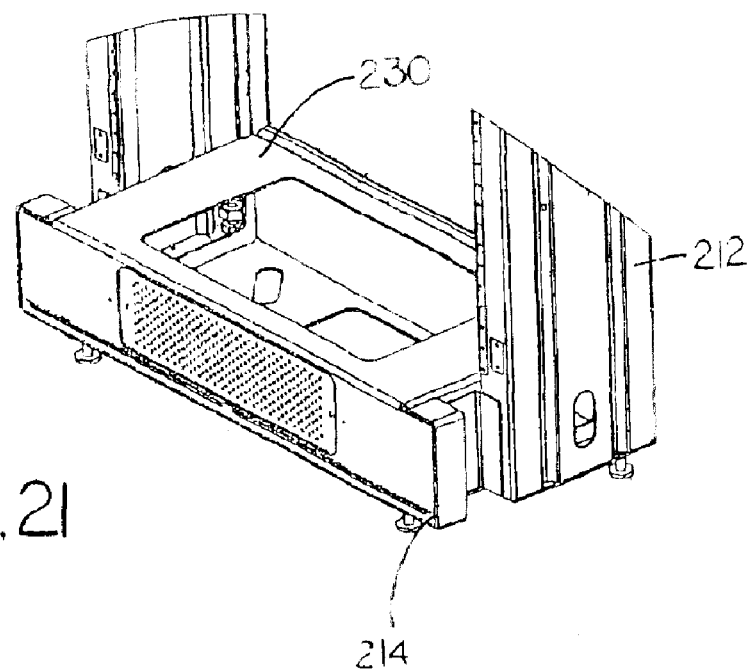
Figure 22:
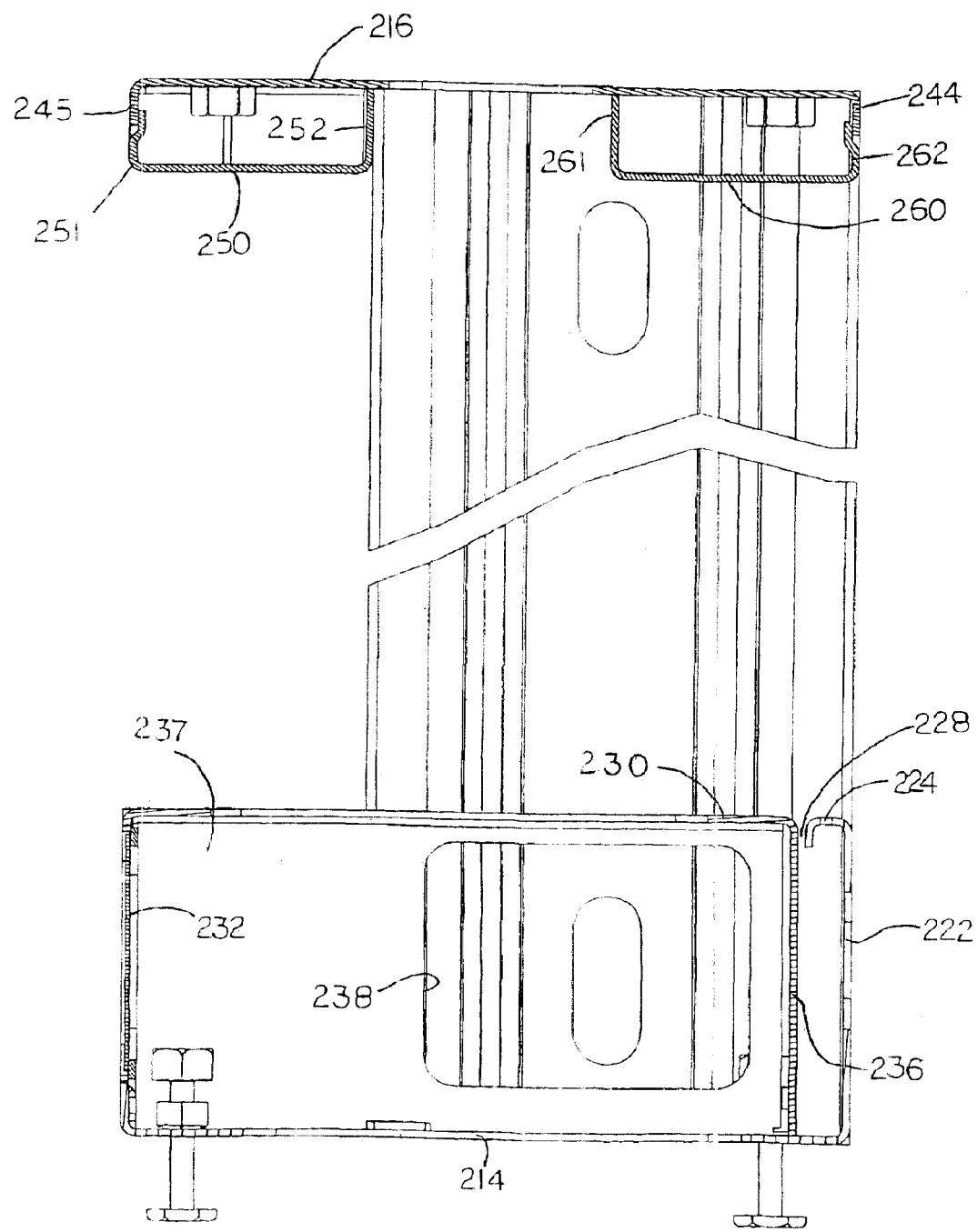
Figure 23:
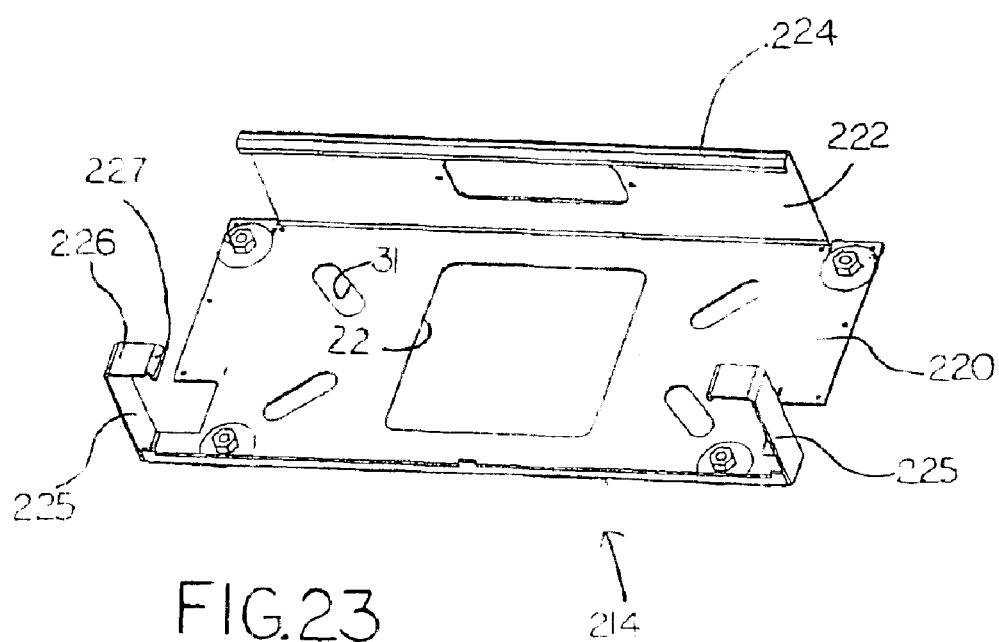
Figure 24:
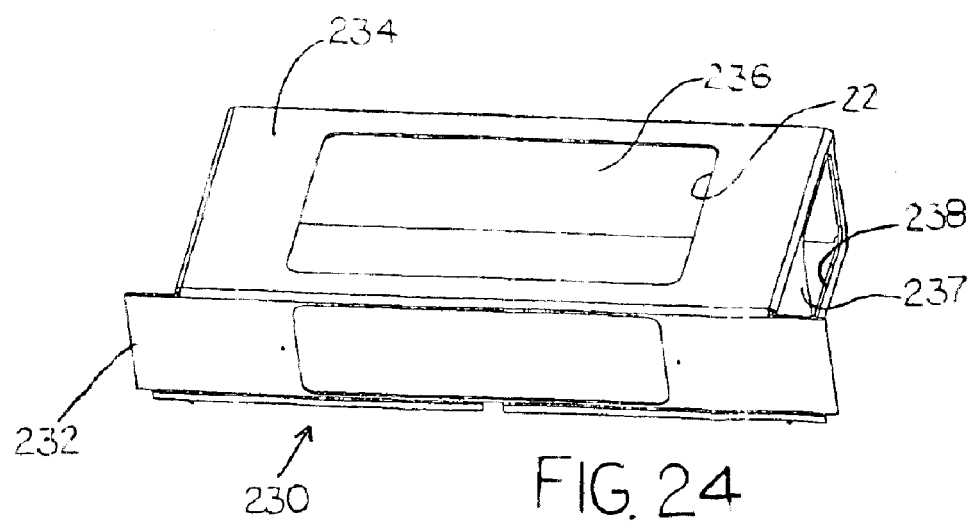
Figure 25:
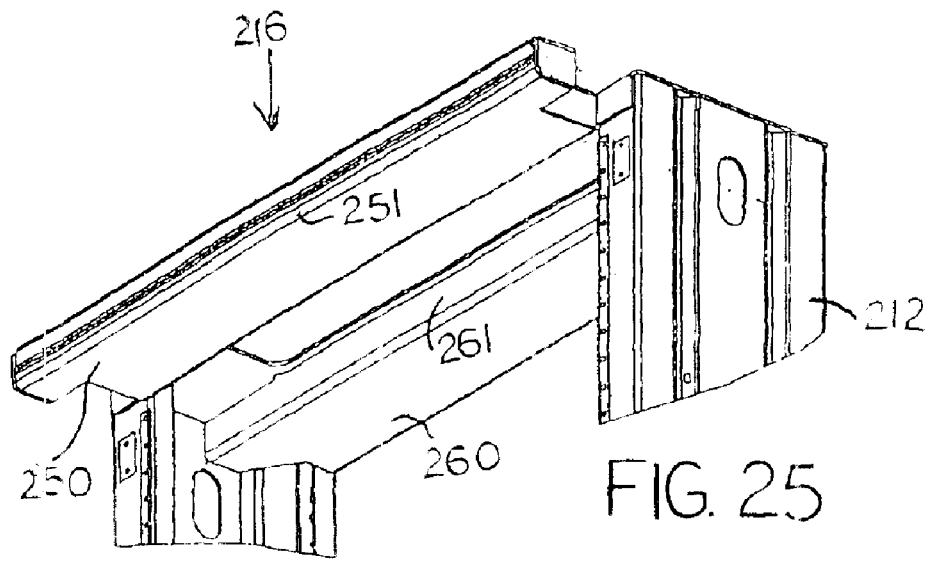
Figure 26:
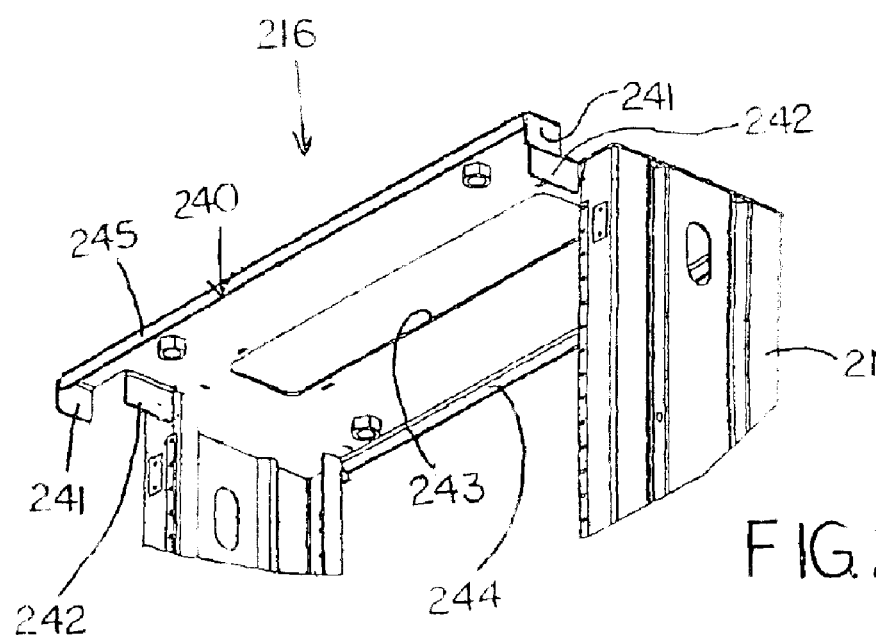
Figure 27:
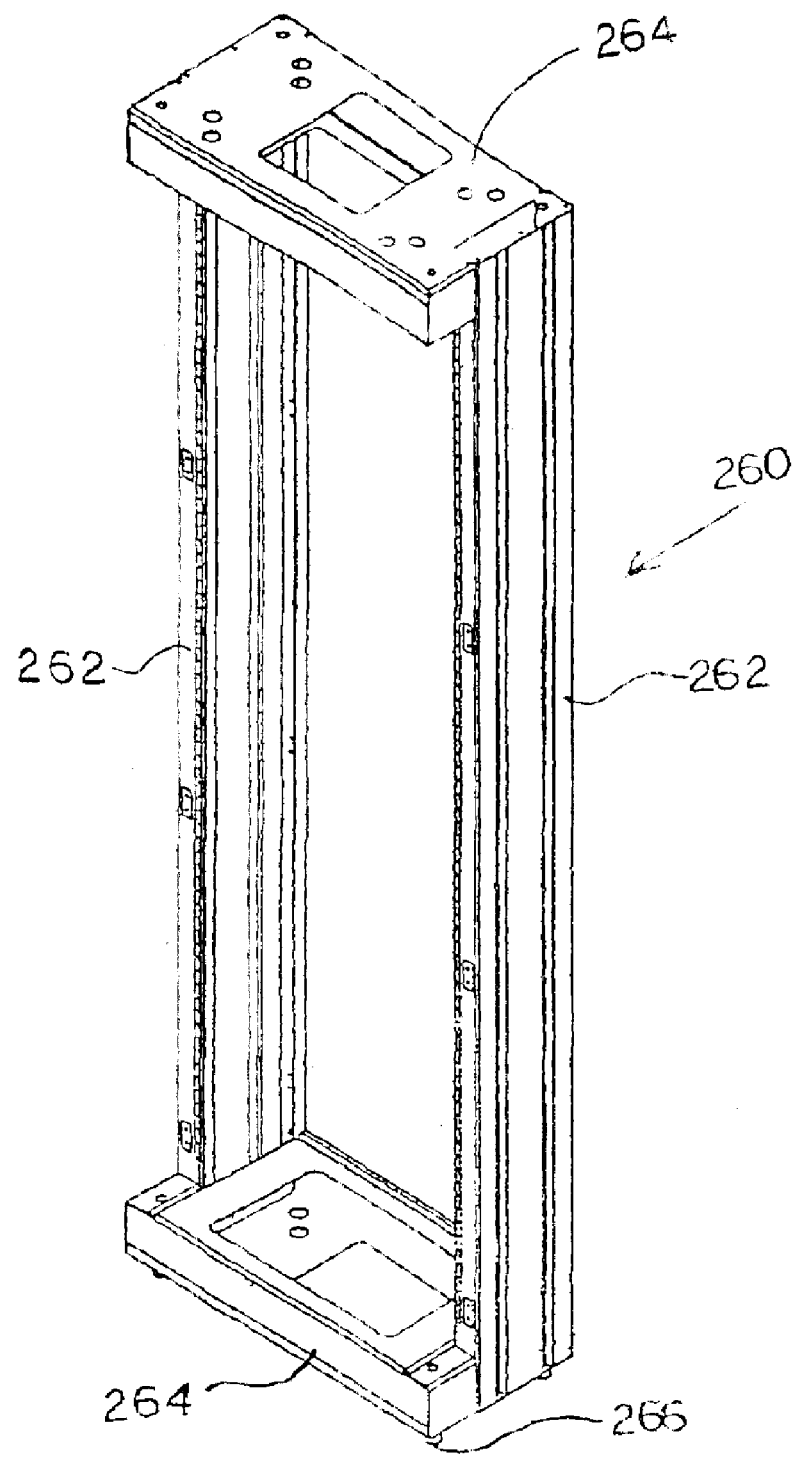

FIGS. 16A, 16B, and 16C are side views showing various placements of a base extension;

FIG. 17 is a perspective view of the base extension shown in FIG. 15;

FIG. 18 is a perspective view of one embodiment of a base extension cover;

FIG. 19 is a perspective view of a second embodiment of an equipment rack according to the present invention;

FIG. 20 is a partial perspective view showing the lower portion of the equipment rack shown in FIG. 19, shown without a base cover;

FIG. 21 is a partial perspective view showing the lower portion of the equipment rack shown in FIG. 19, shown with a base cover;

FIG. 22 is a cross-sectional view of the equipment rack shown in FIG. 19;

FIG. 23 is a perspective view of a base of the equipment rack shown in FIG. 19;

FIG. 24 is a perspective view of a base cover of the equipment rack shown in FIG. 19;

FIG. 25 is a perspective view of a top of the equipment rack shown in FIG. 19;

FIG. 26 is a perspective view of the top of the equipment shown in FIG. 25, shown without channels; and FIG. 27 is a perspective view of a third embodiment of an equipment rack according to the present invention.

DETAILED DESCRIPTION

Figure 1:
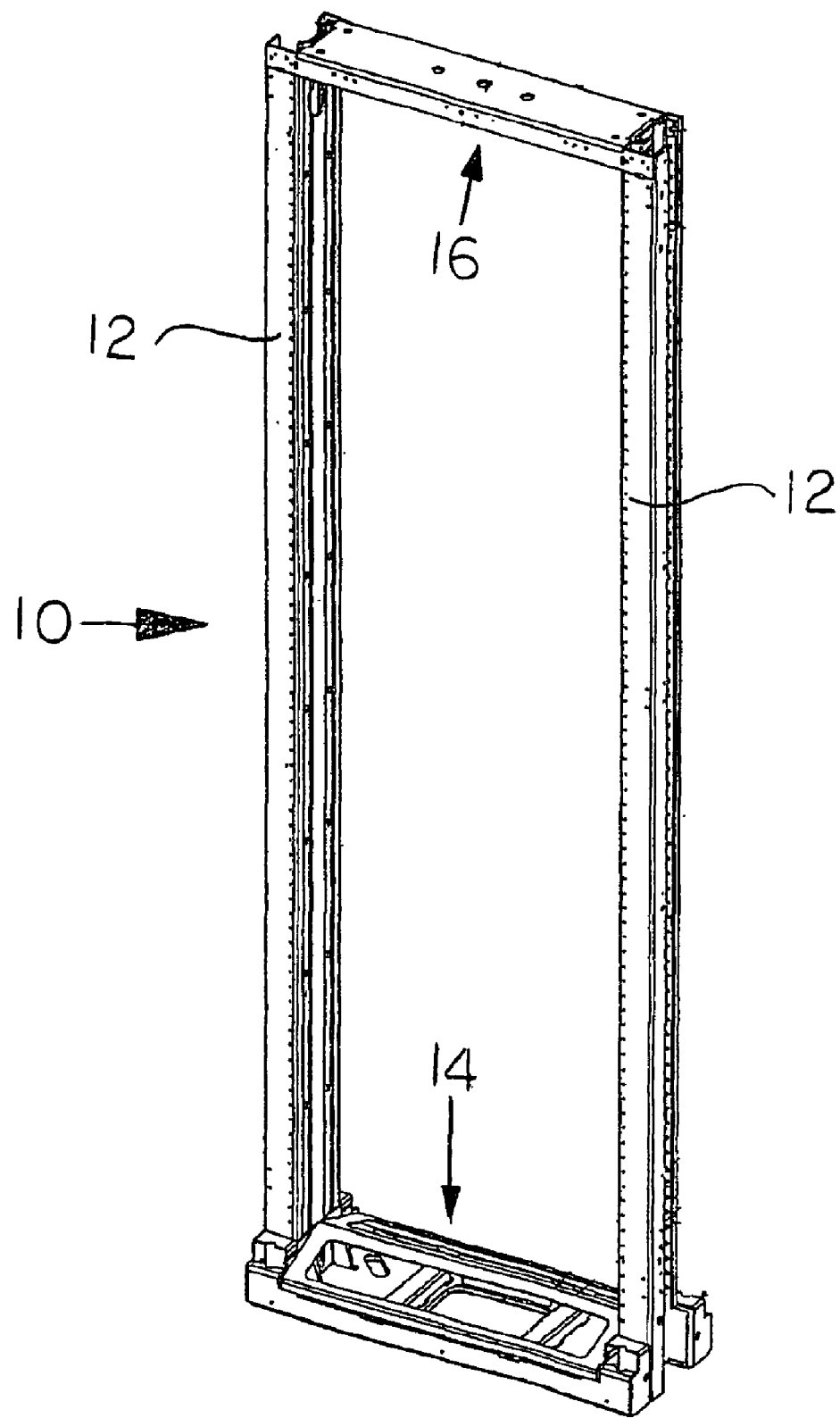
FIG. 1 is a front perspective view of first embodiment of an equipment rack of the present invention.
Figure 2:
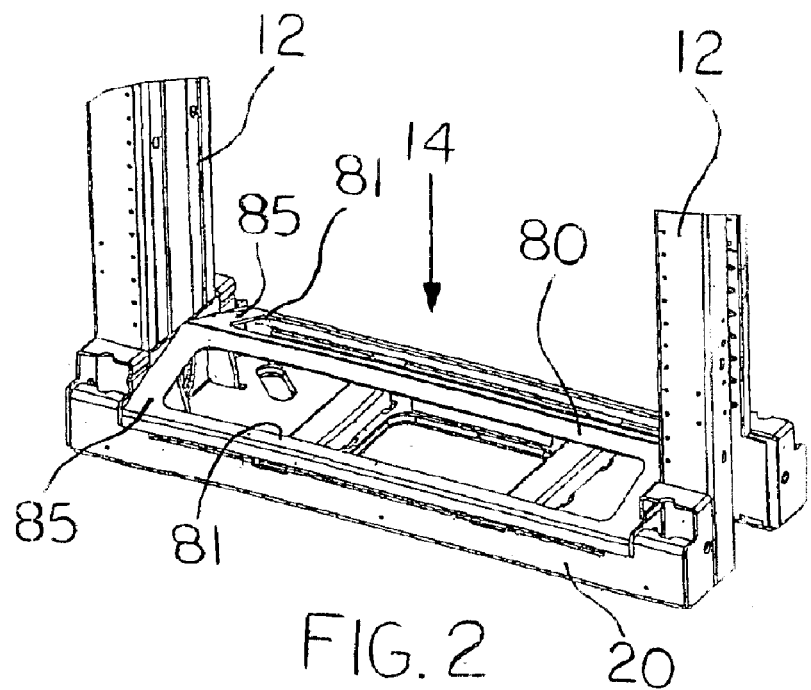
FIG. 2 is a partial perspective view of the equipment rack shown in FIG. 1, showing the outer base, the inner base, the base cover, the vertical posts and lower gussets.
Figure 3:
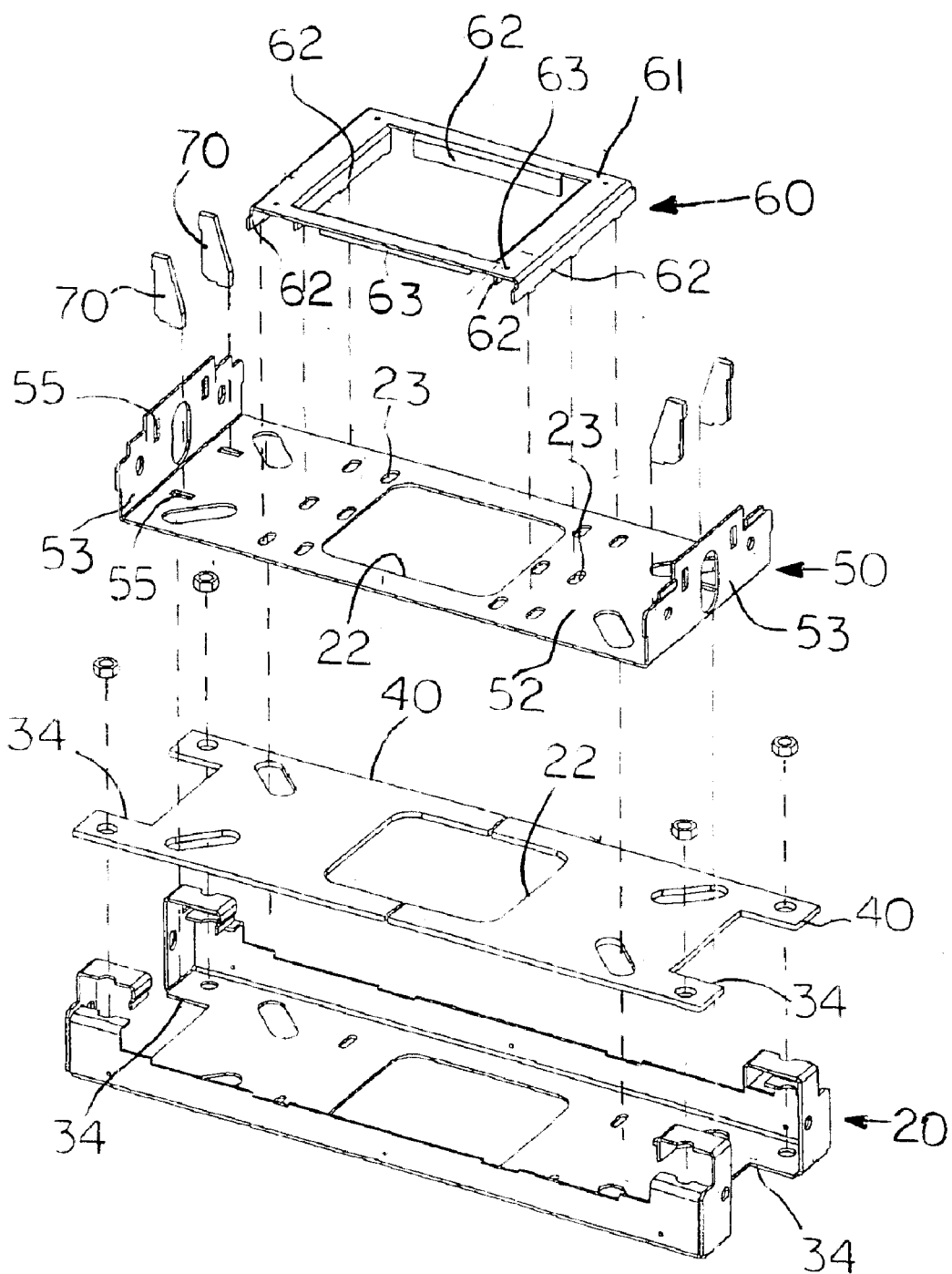
FIG. 3 is an exploded perspective view of the outer base of the equipment rack shown in FIG. 1.
Figure 6:
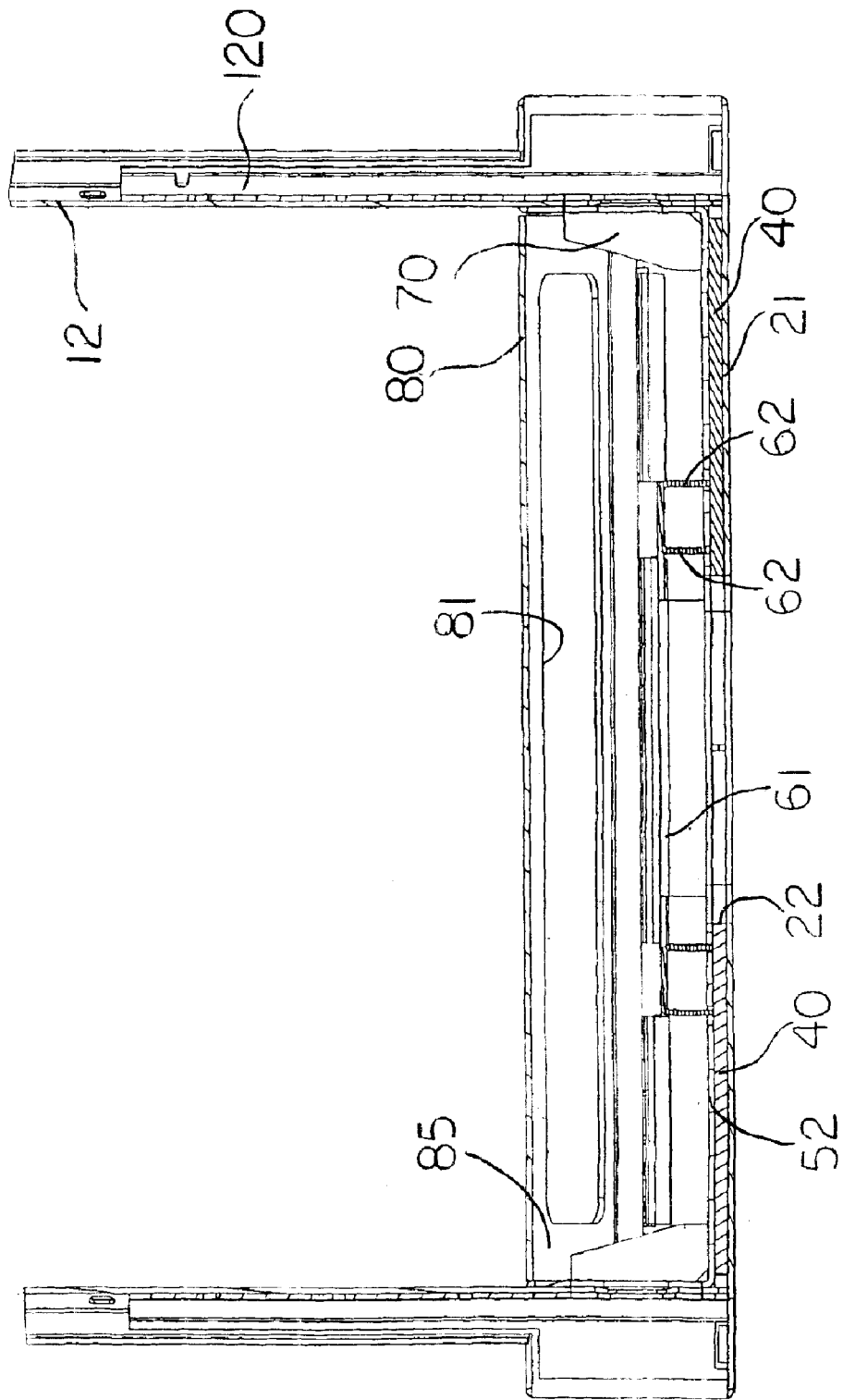
FIG. 6 is a cross-sectional view of the lower portion of the equipment rack shown in FIG. 1.
Figure 7:
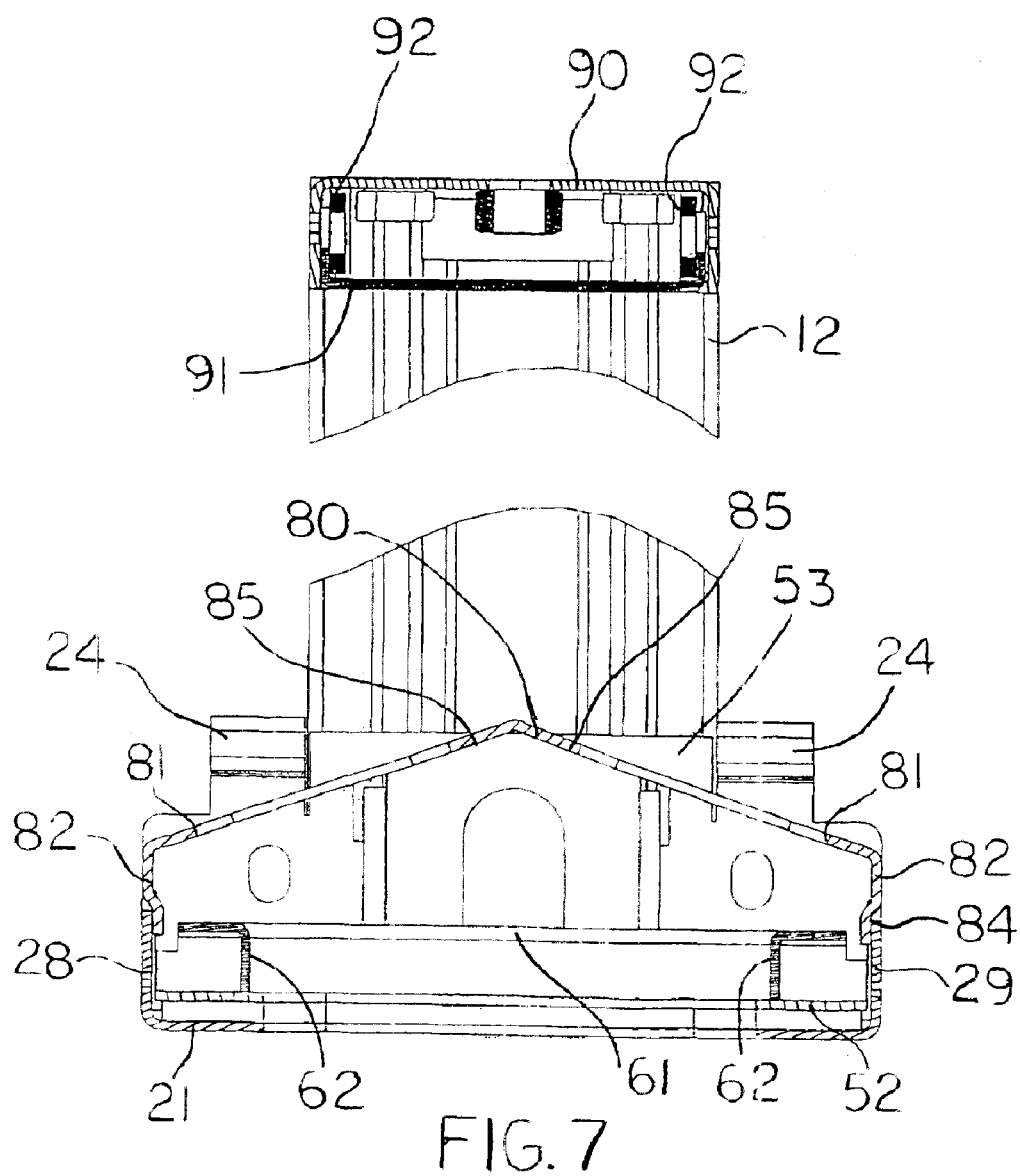
FIG. 7 is a second cross-sectional view of the equipment rack shown in FIG. 1.

FIG. 1 shows a first embodiment of an earthquake resistant equipment rack according to the present invention. The equipment rack 10 generally includes a base 14 and top 16 coupled by two side posts or rails 12. As shown in FIG. 3, the base 14 includes four main stacked components, an outer base 20, two base plates 40, an inner base 50 and a base box 60. These components are welded to another. The rails or vertical upright members 12 fit into notches 34 formed in the outer base 20 and the base plates 40. The rails 12 are also welded to the components of the base 14.

In addition, the outer base 20 includes four gussets 24, one at each corner of the outer base 20, and a front wall 28 and rear wall 29, all formed integrally with the outer base floor 21. A cable aperture 22 is positioned in the center of floor 21. A plurality of weld apertures 23 are provided in the outer base 20 and the inner base 50. These weld apertures 23 are used to plug weld one component to another. For example, the weld apertures 23 in the outer base 20 are used to plug weld the outer base 20 to the base plates 40. The weld apertures 23 in the inner base 50 are used to weld the inner base 50 to the base plates 40 and the base box 60.

Each gusset 24 includes a side 25 extending upward from the floor 21, a top 26 extending horizontally inward from the side 25 and an inner side or return 27 extending downward from the top and spaced from the side 25. As shown in FIG. 5, the returns 27 on the right side of the outer base 20 are shorter than the returns 27 of the left side of the outer base 20. Furthermore, the returns 27 on the left side of the outer base 20 have a small offset towards the side 25. The shorter returns 27 on the right side and the small offset in the returns 27 on the left side of the outer base 20 are provided to facilitate insertion of the inner base 50 into the outer base 20.

The outer base has a gusset reinforcement 30 extending horizontally from the front wall 28 and the rear wall 29. Four oblong shaped anchor bolt holes 31 are provided in the outer base 20, the base plates 40 and the inner base 50. These holes 31 are positioned in a typical pattern and placement for equipment racks of the types used for telephone and communication equipment. Four level adjuster holes 32 are provided near the corners of the outer base 20 and base plates 40. Level adjusters (not shown) are typically attached to the base 14 using hex nuts welded to the base plates 40. The front and rear walls 28, 29 each have two slots 33 that accept adjustable straps 152 on base extensions 150 (see FIGS. 15 through 17). Base plate 40 is preferably formed in two sections, as shown in FIG. 3, to facilitate insertion of base plate 40 into outer base 20.

The inner base 50 is formed from a single piece of material and has two ends 53 extending upward from a floor 52. Four rail gussets 70 provide additional reinforcement to ends 53 and base 14. Each rail gusset 70 has two tabs (not numbered) that fit into slots 55 in inner base 50. Rail gussets 70 are then welded to inner base 50. The final component of base 14 is base box 60. Base box 60 basically has a rectangular frame 61 with six sides 62 extending downward from the rectangular frame 61. There are four sides 62 extending downward from the inside and outside edges of the right and left sides of frame 61 and two sides 62 extending downward from the inside edges of the front and rear of frame 61. Base box 60 includes four extension attachment threaded holes 63 for accepting a screw (not shown) to attach base extension 150 to base 14.

A dog-house shaped cover 80 is welded to base 14. The cover 80 includes two inclined portions 85 having an access aperture 81 in each inclined portion 85. Front and rear walls 82 extend downward from the inclined portions 85. Both walls 82 include an inwardly offset lower portion so that walls 82 overlap and nest behind base front wall 28 and base rear wall 29. A small space or weld pocket 84 is provided on the outside surface of base 14 where the cover 80 and the outer base 20 overlap. This allows the two parts to be welded together and finished by grinding to form a smooth flat outer surface where the parts have been welded. In addition cover 80 is also welded to inner base 50 and rails 12.

Rails 12 are shown in FIGS. 9 and 10. Each rail 12 is basically formed with a flat planar central portion 130 with a front flange 132 and rear flange 133 extending inward from central portion 130. In some embodiments, the length of flanges 132, 133 are equal. In other embodiments, as shown in FIG. 10, the rear flange 133 is longer than front flange 132. Both flanges 132, 133 have returns 134 extending at right angles from each flange 132, 133. Returns 134 extending towards one another and are parallel to and spaced from central portion 130. Preferably, two inwardly extending (towards returns 134) or inverted V portions 131 are formed in central portion 130. V portions 131 preferably are spaced apart and extend substantially the entire length of rail 12. V portions 131 act to diffuse seismic forces and direct seismic forces upwardly away from base 14. Generally, seismic forces during an earthquake are directed from the corners of base 14 into rails 12, usually in a horizontal direction. When the seismic forces reach V portions 131, V portions diffuse the seismic forces by directing the seismic forces vertically away from base 14, thereby reducing the forces on base 14 during an earthquake. Preferably, V portions 131 from a 900 angle, as shown in FIG. 10.

Figure 13:
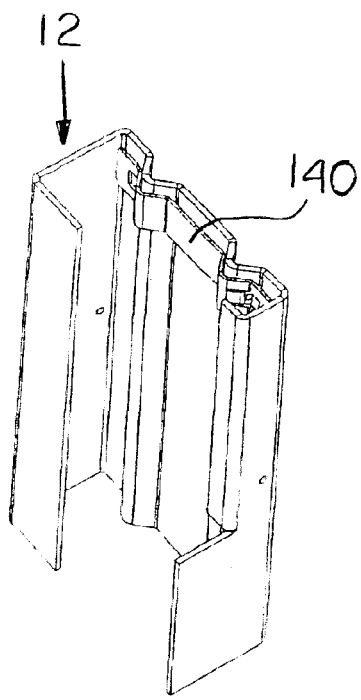
FIG. 13 is a partial perspective view of a portion of a vertical post illustrating a cable tie bar.
Figure 14:
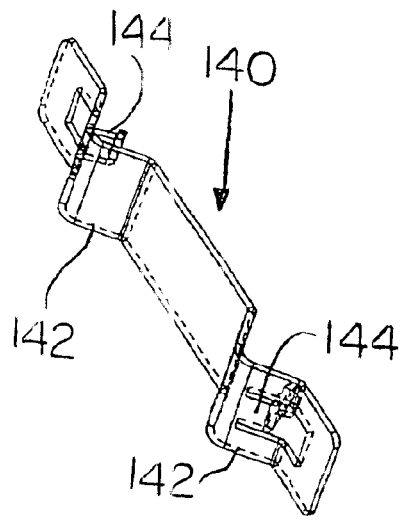
FIG. 14 is a perspective view of the cable tie bar shown in FIG. 13.

In some embodiments, rails 12 are provided with a plurality of vertically spaced apart apertures 135 in the V portions 131. Preferably, the apertures 135 in one V portion 131 have the same vertical spacing as the apertures 135 in the other V portion 131. These apertures 135 can be used for cable ties to attach cables to rails 12. Or these apertures 135 can be used in conjunction with cable tie bars 140, shown in FIGS. 13 and 14. Cable tie bars 140 are generally a flat bar with two V portions 142 that correspond in shape to rail V portions 131. Preferably, cable tie bars 140 include hooks 144 that engage rail apertures 135 to releasingly attach cable tie bars 140 to rails 12. When using cable tie bars 140, cables would be positioned between the cable tie bar 140 and the rail central portion 130.

Figure 8:
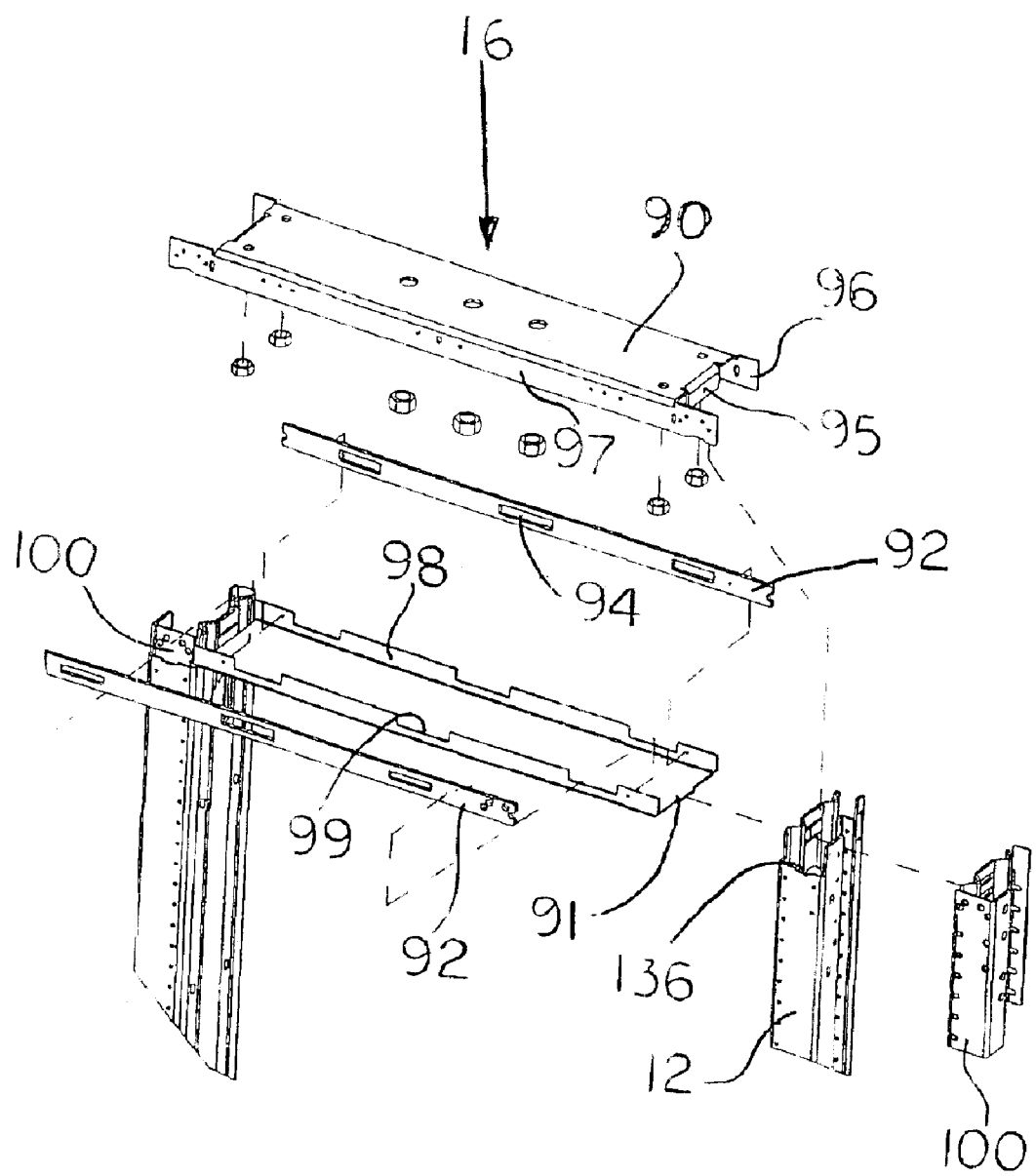
FIG. 8 is an exploded perspective view of the top of the equipment rack shown in FIG. 1.

FIG. 8 shows an exploded perspective view of the upper portion of earthquake resistant equipment rack 10. Top 16 is formed from four sections of sheet metal, a top rail 90, an inside mid rail 91 and two top stiffeners 92, all welded to one another. Top rail 90 is shaped like a box cover with tabs 96 extending from each corner and is formed from a single piece of sheet metal. Top rail 90 has two downwardly extending sides 97 and two downwardly extending ends 95. A gap is provided between tabs 96 and ends 95 to permit inside mid rail 91, top stiffeners 92 and reinforcement top stiffeners 100 to fit into the gap. Inside mid rail 91 has two upwardly extending sides 98 with a plurality of weld cutouts 99 formed in each side 98. Top stiffeners 92 include a plurality of weld pockets 94. Weld cutouts 99 and weld pockets 94 are provided to permit the three pieces, top rail 90, inside mid rail 91 and top stiffeners 92 to be welded to one another. These pieces overlap one another to form multiple layers of metal to provide for increased seismic force resistance. Rails 12 have a cutout 136 at an upper end. Top rail tabs 96 fit into this cutout 136 to provide a flush fit of the top 16 to the rails 12.

Figure 12A:
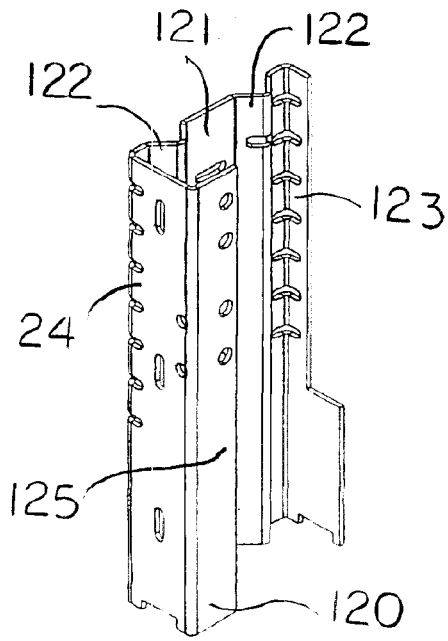
FIG. 12A is a perspective view of a lower stiffener.
Figure 12B:
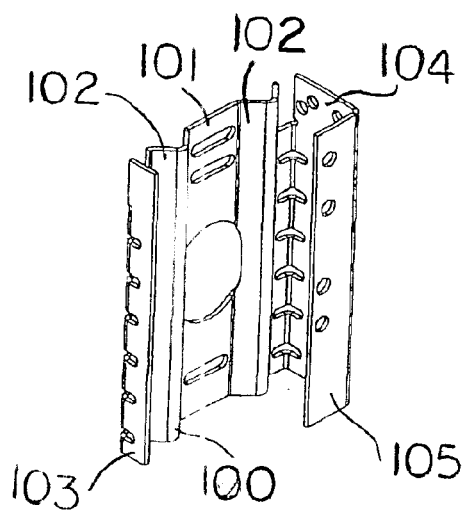
FIG. 12B is a perspective view of an upper stiffener.

Reinforcing stiffeners or gussets 100, 120 are provided at the upper ends and the lower ends of each rail 12. Upper gusset 100 and lower gusset 120 are shown in FIGS. 12A and 12B. Each gusset 100, 120 has a shape that is complimentary to the shape of rails 12, with a central portion 101, 121, two spaced V portions 102, 122, a rear flange 103, 123, a front flange 104, 124 and one return 105, 125. Each gusset is nested into the V portions 131 of rail 12 and is welded to rail 12 and any adjacent portions of the base 14, top 16. Gussets 100, 120 provide additional stiffening to the corner of equipment rack 10.

Preferably, equipment rack 10 is provided in a single size, that is with fixed width and depth. Sometimes it is necessary to fit these equipment racks in opening of differing depths. To accommodate this, base extensions 150 are provided, as shown in FIGS. 15 through 18. Normally, two base extensions 150 are used, one on the front and one on the rear of equipment rack 10, as shown in the Figures. However, a single extension 150 could be used as needed. The extension 150 is simple sheet metal form that matches the exterior shape of base 14. Extension 150 is not intended to provide additional strength to equipment rack 10. Each extension 150 includes a strap 152 that fits into base extension slot 33. Each strap 152 includes an adjustment slot 154 that accepts a screw (not shown) to fasten extension 150 to base 14 using the threaded hole 63 in base box 60. Straps 152 and adjustment slots 154 allow the base extension 150 to be positioned variable distances from base 14 to accommodate different depths, as shown in FIGS. 16A through 16C. An extension cover 156 is provided to enclosed the open space within the base extension 150 and between the base extension 150 and base 14. These covers 156 can be provided in various sizes to accommodate the different possible configurations, such as those shown in FIGS. 16A through 16C.

Several different concepts have been used in equipment rack 10 to increase the strength of rack 10 to resist the seismic forces from an earthquake. One uses the concept of Box on Box. A plurality of box shaped or multi-sided structures are included within an outer box structure. The box shaped structures can be fully closed or can include apertures or other openings. Preferably, the box shaped structures are six sided. Other multi-sided structures could be used, such as a triangle. For example, the rail box 60 positioned within outer base 20 is a box within a box. Others include the boxed in area provided by the gussets 24. Another concept is using multiple overlapping layers of sheet metal, such as the overlapping layers of the outer base 20, base plates 40, and inner base 50, or the overlapping layers of the top rail 90, inside mid rail 91 and top stiffeners 92. Forming the base 14 with a non-removable cover 80 further strengthens rack 10. Also, the reinforcing gussets 100, 120 having corresponding shapes to rails 12 and being nested within rails 12 provide additional strength to the corners of rack 10 and allow for greater resistance to seismic forces. Another concept is using two V shaped projections in the outer face of rails 12 to diffuse seismic forces by directing seismic forces upward away from base 12.

A second embodiment of an earthquake resistant equipment rack is shown in FIGS. 19 through 26. Equipment rack is formed of a base 212 and top 216 attached by two side posts or rails 212. Base 214, top 216 and rails 212 are welded to one another. Base 214 includes a floor 220 with an integral upwardly extending back wall 222. Back wall 222 has a horizontally extending return 224 extending from its upper edge. Gussets are provided in each front corner of base 214. Each gusset includes an upwardly extending side 225 with a horizontally extending top 226 and a short return 217 extending downward from top 226. The base 214 includes level adjuster holes (not numbered), cable access aperture 22 and anchor bolts holes 31, similar to those described above for equipment rack 10.

A cover 230 is non-removably attached (preferably by welding) to base 214. Cover 230 includes a top with downwardly extending front and back walls, 232, 236 and downwardly extending side walls 237. Each side wall 237 has a cable access aperture 238. When assembled, top back wall 236 is offset from base back wall 222. A small gap 228 is provided between return 224 and cover 230 to permit welding of cover 230 to base 214. Base 214 is strengthened because this offset of the two walls 236, 222 forms a box shaped reinforcing structure within base 214.

Rails 212 preferably include two spaced apart V portions like the V portions 131 in rails 12.

Top 216 is formed from three components, top member 240, front channel 250 and rear channel 260, all welded to one another. Top member 240 has a main central flat portion with first and second end tabs 241, 242 extending downward from the sides near the front corners (See FIG. 26). Short front and back walls 245, 244 extend downward from the front and rear edges of top member 240. A large cable aperture 243 is provided in the center of top member 240. The front and rear channels 250, 260 have similar shapes with upwardly extending front walls 251, 262 and rear walls 252, 262. Front and rear channels 250, 260 are fit to the underside of top member 240 adjacent the front and rear edges of top member 240. Channels 250, 260 reinforce top member 240 by forming box structures as shown in FIG. 22.

Another embodiment of an earthquake resistant equipment rack is shown in FIG. 27. In this embodiment, the equipment rack 260 is formed from two substantially identical bases 264 and two rails 262. One base 264 is positioned at the bottom of the rack 262 and the other base 264 is positioned at the top of the rack 262. Basically, this rack 262 is symmetrical about horizontal plane positioned midway between the top surface and the bottom surface of bases 264. Lower base 264 will have lever adjusters 266 positioned at each corner that won't be present on the upper base 264. Some of the accessory components added to rails 262, such as hinges and cable apertures, may not be symmetrical about the mid-point horizontal plane.

What is claimed is:

1. An earthquake resistant equipment rack, comprising:
   a rectangular base;
   two vertical uptight members coupled to and extending upward from the base; and
   a top coupled to and extending between upper ends of the vertical upright members,
   at least one of the rectangular base and the top being comprised of a plurality of non-removable smaller multi-sided support structures integral with and within an outer multi-sided support structure, wherein at least one of the non-removable smaller multi-sided support structure is six sided.

2. The earthquake resistant equipment rack according to claim 1, wherein at least one of the non-removable smaller multi-aided support structures is at least partially enclosed.

3. The earthquake resistant equipment rack according to claim 2, wherein at least one of the non-removable smaller multi-sided support structures is fully enclosed.

4. The earthquake resistant equipment rack according to claim 3, wherein at least one of the non-removable smaller multi-sided support structures comprise a plurality of segments welded to one another.

5. An earthquake resistant equipment rack, comprising:
   a rectangular base;
   two vertical upright members coupled to and extending upward from the base; and
   a top coupled to and extending between upper ends of the vertical upright members,
   at least one of the rectangular base and the top being comprised of a plurality of non-removable smaller multi-sided support structures integral with and within an outer multi-sided support structure, wherein at least one side of at least one of the non-removable smaller multi-sided support structures is contiguous with at least one side of at least one other non-removable smaller multi-sided support structure.

6. The earthquake resistant equipment rack according to claim 5, wherein at least one of the non-removable smaller multi-sided support structures is box-shaped.

7. The earthquake resistant equipment rack according to claim 6, wherein the box-shaped multi-sided support structures are closed box-shaped structures.

8. An earthquake resistant equipment rack, comprising:
a rectangular base;
two vertical upright members coupled to and extending upward from the base; and
a top coupled to and extending between upper ends of the vertical upright members,
at least one of the rectangular base and the top being comprised of a plurality of non-removable smaller multi-sided support structures integral with and within an outer multi-sided support structure, wherein at least one side of at least one of the non-removable smaller multi-sided support structures forms at least one side of it least one other non-removable smaller multi-sided support structures.

9. An earthquake resistant equipment rack, comprising:
a rectangular base;
two vertical upright members coupled to and extending upward from the base; and
a top coupled to and extending between upper ends of the vertical upright members,
at least one of the rectangular base and the top being comprised of a plurality of non-removable smaller closed box-shaped support structures integral with and within an outer closed box-shaped support structure.

10. An earthquake resistant equipment rack comprising:
two vertical upright member; and
two horizontally extending members coupled to ends of the vertical upright members, one horizontally extending member being a base coupled to lower ends of the vertical upright members, the other horizontally extending member being a top rail coupled to upper ends of the vertical upright members, at least one horizontally extending member including at least one box member, the at least one box member being formed of a plurality of separate box segments, each box segment having a plurality of walls, the box segments being coupled with one another, at least one vertical wall of a box segment at least partially overlapping a vertical wall of another box segment.

11. The earthquake resistant equipment rack according to claim 10, wherein the box segments forming a box member are nested together.

12. An earthquake resistant equipment rack comprising:
a rectangular base;
two vertical upright members coupled to and extending upward from the base; and
a top coupled to and extending between upper ends of the vertical upright members,
each vertical upright member having two spaced apart vertically extending seismic force diffusers therein, the vertically extending seismic force diffusers directing seismic forces in a vertical direction.

13. The earthquake resistant equipment rack according to claim 12, wherein each seismic force diffuser is a vertically extending V-shaped portion in the vertical upright member.

14. The earthquake resistant equipment rack according to claim 13, wherein the vertically extending V-shaped portion protrudes inward from the vertical upright member.

15. The earthquake resistant equipment rack according to claim 13, wherein each vertically extending V-shaped portion has a plurality of spaced apart apertures therein.

16. The earthquake resistant equipment rack according to claim 15, further comprising:
a plurality of tie bars removably engaging an aperture in each vertically extending V-shaped portion.

17. The earthquake resistant equipment rack according to claim 16, wherein each tie bar is a strip having two V-shaped engaging portions having corresponding shapes to the vertical uptight member vertically extending V-shaped portions.

18. The earthquake resistant equipment rack according to claim 16, wherein each tie bar has two hooks thereon adapted to releasingly engage the vertically extending V-shaped portion apertures.

19. An earthquake resistant equipment rack comprising:
rectangular base;
two vertical upright members coupled to and extending upward from the base, each vertical uptight member having a cross-section consisting of a front flange, a rear flange, and a central portion extending therebetween, the central portion including two spaced apart inverted-V portions extending from a general plane of the central portion of each vertical upright member on the same side thereof as the front and rear flanges, along substantially the entire length of the vertical upright member;
a top coupled to and extending between upper ends of the vertical upright members; and
a plurality of reinforcement gussets, each gusset being non-removably attached to a vertical upright members and to one of the base and the top, each reinforcement gusset having corresponding inverted-V portions to the vertical uptight member inverted-V portions, the vertical upright member inverted-V portions being in nested engagement with the reinforcement gusset inverted-V portions.

20. The earthquake resistant equipment rack according to claim 19, wherein the number of reinforcement gussets is two, each reinforcement gusset being non-removably attached to a vertical upright member and the top.

21. The earthquake resistant equipment rack according to claim 19, wherein the number of reinforcement gussets is two, each reinforcement gusset being non-removably attached to a vertical upright member and the base.

22. The earthquake resistant equipment rack according to claim 19, wherein the number of reinforcement gussets is four, two reinforcement gussets being non-removably attached to a vertical upright member and the top and two reinforcement gussets being non-removably attached to a vertical upright member and the base.

23. An earthquake resistant equipment rack comprising:
a rectangular base;
two vertical upright members coupled to and extending upward from the base, each vertical upright member having a cross-section consisting of a front flange, a rear flange, and a central portion extending therebetween, the central portion including two spaced apart inverted-V portions extending from a general plane of the central portion of each vertical upright member on the same side thereof as the front and rear flanges, along substantially the entire length of the vertical upright member, each inverted-V portion having a plurality of spaced apart apertures therein;

a top coupled to and extending between upper ends of the vertical upright members; and a plurality of tie bars removably engaging an aperture in each inverted-V portion.

24. The earthquake resistant equipment rack according to claim 23, wherein each tie bar is a strip with two V-shaped engaging portions having corresponding shapes to the vertical upright member vertically extending V-shaped portions.

25. The earthquake resistant equipment rack according to claim 23, wherein each tie bar two hooks thereon adapted to releasingly engage the vertically extending inverted-V portion apertures.

26. The earthquake resistant equipment rack according to claim 23, wherein for each aperture in one inverted-V portion, there is a correspondingly vertically spaced aperture in the other inverted-V portion.

27. The earthquake resistant equipment rack according to claim 23, wherein the apertures to which a tie bar is engaged are spaced equal vertical distances from one end of the vertical upright member.

28. An earthquake resistant equipment rack comprising:
a rectangular base, the base having a plurality of upwardly extending sides;
two vertical upright members coupled to and extending upward from the base;
a top coupled to and extending between upper ends of the vertical upright members; and
a cover non-removably attached to the base, the cover extending from proximate a front of the base to proximate a rear of the base.

29. The earthquake resistant equipment rack according to claim 28, wherein the cover has at least one access aperture therein.

30. The earthquake resistant equipment rack according to claim 28, wherein the cover comprises two inclined portions, each inclined portion having an access aperture therein.

31. The earthquake resistant equipment rack according to claim 30, wherein each inclined portion extends from a lower edge adjacent one of a base front face or a base back face to a higher edge proximate a point positioned between a front edge of the base and a rear edge of the base.

32. The earthquake resistant equipment rack according to claim 31, wherein the higher edge of one inclined portion is coupled with the higher edge of the other inclined portion.

33. The earthquake resistant equipment rack according to claim 31, wherein the cover is formed of a single sheet of material, the sheet of material being bent about a line, the line forming the upper edge of each inclined portion.

34. The earthquake resistant equipment rack according to claim 28, wherein the cover has a rectangular shape having a top and downwardly extending sides.

35. The earthquake resistant equipment rack according to claim 34, wherein a rear side of the cover is spaced from a rear side of the base.

36. The earthquake resistant equipment rack according to claim 35, wherein the rear aide of the base has a horizontal portion extending from an edge of the rear side, the horizontal portion being non-removably attached to the rear side of the cover.

37. An earthquake resistant equipment rack comprising:
a rectangular base;
two vertical upright members coupled to and extending upward from the base; and
a top coupled to and extending between upper ends of the vertical upright members, at least one of the base and the top having a plurality of support structures therein, the support structures overlapping one another forming a plurality of vertically extending multiple thickness support areas and horizontally extending multiple thickness support areas, each multiple thickness support area having a plurality of layers of metal.

38. The earthquake resistant equipment rack according to claim 37, wherein the base includes an outer base and an inner base substantially co-planar with the outer base, the inner base overlapping the outer base thereby forming a horizontal multiple thickness support area.

39. The earthquake resistant equipment rack according to claim 38, wherein the base further includes a base plate substantially co-planar with the outer base and the inner base, the base plate being positioned between the outer base and the inner base, the base plate overlapping the inner base and the outer base thereby forming a horizontal multiple thickness support area.

40. The earthquake resistant equipment rack according to claim 37, wherein the base includes upwardly extending front and rear sides, and further comprising:
a cover non-removably attached to the base, the cover having downwardly extending front and rear sides, the base front side overlapping with the cover front side forming a vertical multiple thickness support area and the base rear side overlapping with the cover rear side forming another vertical multiple thickness support area.

41. The earthquake resistant equipment rack according claim 37, wherein the top comprises two channels, each channel having a planar central portion and sides extending from the planar central portion, the sides of one channel overlapping with the sides of the other channel forming a vertical multiple thickness support area.

42. The earthquake resistant equipment rack according to claim 41, wherein the top further comprises two stiffeners, each stiffener overlapping with one side of one channel and the corresponding side of the other channel, the overlapping sides of the channels and the stiffeners forming vertical multiple thickness support area.

43. An earthquake resistant equipment rack comprising:
a rectangular base, the base having a plurality of upwardly extending sides;
two vertical upright members coupled to end extending upward from the base;
a top coupled to and extending between upper ends of the vertical upright members; and
a cover attached to the base, the cover comprising two inclined portions.

44. The earthquake resistant equipment rack according to claim 43, wherein each inclined portion has an access aperture therein.

45. The earthquake resistant equipment rack according to claim 43, wherein each inclined portion extends from a lower edge adjacent one of a base front face or a base back face to a higher edge proximate a point positioned between a front edge of the base and a rear edge of the base.

46. The earthquake resistant equipment rack according to claim 45, wherein the higher edge of one inclined portion is coupled with the higher edge of the other inclined portion.

47. The earthquake resistant equipment rack according to claim 45, wherein the base cover is formed of a single sheet of material, the sheet of material being bent about a line, the line forming the higher edge of each inclined portion.

48. An earthquake resistant equipment rack, comprising:
a rectangular base having a floor, a front laterally extending face integrally formed with the floor and a back laterally extending face integrally formed with the floor;
two vertical upright members coupled to and extending upwardly from the base, each vertical upright member being positioned along a side of the base about midway between a front edge of the base and a back edge of the base;
a top rail coupled to and extending between upper ends of the vertical upright members;
a base interior insert having a horizontally extending floor coupled to the base floor; and
a base cover coupled to the base and the vertical upright members, the base cover comprising two inclined portions, each inclined portion having an access aperture therein permitting access to the interior of the base, each inclined portion extending from a lower edge adjacent one of the base front face or the base back face to a higher edge proximate a point positioned between a front edge of the base and a rear edge of the base,
wherein the base cover and base form two layers of laterally extending material across the front face and rear face of the base and the base and base interior insert form two layers of horizontally extending material extending substantially throughout a central interior portion of the base.

49. An earthquake resistant equipment rack comprising:
a rectangular base;
two vertical upright members coupled to and extending upward from the base;
a top coupled to and extending between upper ends of the vertical upright members; and
at least one base extension coupled with the base, front and rear faces of the base extension having a shape that corresponds to one of front and rear faces of the base.

50. The earthquake resistant equipment rack according to claim 49, wherein the number of base extension is two, one coupled with a front of the base, the other coupled with a rear of the base.

51. An earthquake resistant equipment rack comprising:
a rectangular base;
two vertical upright members coupled to and extending upward from the base;
a top coupled to and extending between upper ends of the vertical upright members; and
at least one base extension adjustably coupled with the base.

52. The earthquake resistant equipment rack according to claim 51, wherein the base extensions have at least one strap extending therefrom and the base has at least one corresponding strap aperture therein, the at least one strap extending into a corresponding at least one strap aperture.

53. The earthquake resistant equipment rack according to claim 52, wherein each strap has an adjustment slot therein.

54. An earthquake resistant equipment rack comprising:
two vertical upright members; and
two substantially identical bases, one base being coupled to lower ends of the vertical upright members, the other base being coupled to upper ends of the vertical upright members, wherein each base includes a base cover non-removably attached to the base and the vertical uptight members.

55. The earthquake resistant equipment rack according to claim 54, wherein each base has a plurally of floor attachment apertures therein.

56. The earthquake resistant equipment rack according to claim 54, wherein the rack is symmetrical about a horizontal plane positioned midway between a bottom edge of the base coupled to the lower ends of the vertical upright members and a top edge of the base coupled to the upped ends of the vertical upright members.

57. An earthquake resistant equipment rack comprising:
a rectangular base;
two vertical upright members coupled to and extending upward from the base; and
a top coupled to and extending between upper ends of the vertical upright members,
the base comprising an outer base having a floor; a back wall integrally formed with the floor; a front wall integrally formed with the floor; and four upstanding gussets integrally formed with the floor to provide structural rigidity to a coupling of the vertical upright member with the base, each gusset being positioned proximate a corner of the base,
the outer base floor, the outer base back wall, the outer base front wall and the outer base gussets forming a unitary structure formed from a single sheet of metal.

58. The earthquake resistant equipment rack according to 57 wherein each gusset includes a side portion extending upward from the floor, a horizontal portion extending horizontally inward from an upper end of the side portion; and an inside portion extending vertically downward from the horizontal portion and being spaced apart from the side portion.

59. The earthquake resistant equipment rack according to claim 58, wherein inside edges of the gusset side portion, the gusset horizontal portion and the gusset inside portion are coupled with adjacent portions of a vertical upright member.

60. The earthquake resistant equipment rack according to claim 57, wherein the base further comprises a base plate having a horizontally extending planar portion coupled to the outer base floor.

61. An earthquake resistant equipment rack comprising:
a rectangular base;
two vertical upright members coupled to and extending upward from the base; and
a top coupled to and extending between upper ends of the vertical upright members,
the base comprising: an outer base having a floor; a back wall integrally formed with the floor; a front wall integrally formed with the floor; and four upstanding gussets integrally formed with the floor to provide structural rigidity to a coupling of the vertical upright member with the base, each gusset being positioned proximate a corner of the base, the base further comprising: a base plate having a horizontally extending planar portion coupled to the outer base floor; and an inner base having a horizontally extending floor coupled to the base plate.

62. The earthquake resistant equipment rack according to claim 61, wherein the inner base floor extends from proximate an interior face of one vertically extending member to proximate an interior face of the other vertically extending member.

63. The earthquake resistant equipment rack according to claim 62, wherein the inner base floor has an upwardly extending side portion at each end thereof and integral with the inner base floor, the inner base side portions being coupled with the interior face of a vertically extending member and the inside portion of two gussets.

64. The earthquake resistant equipment rack according to claim 61, further comprising:
a base box coupled with the inner base and the base plate.

65. The earthquake resistant equipment rack according to claim 64, wherein the base box has a rectangular frame having a plurality of downward extending sides.

66. The earthquake resistant equipment rack according to claim 65, wherein the number of downwardly extending sides is six, four downwardly extending sides extending from an inner periphery of the base box rectangular frame and two downwardly extending sides extending from an outer periphery of the base box rectangular frame.

67. The earthquake resistant equipment rack according to claim 65, wherein the downward extending sides are coupled with the inner base and the base plate.

68. The earthquake resistant equipment rack according to claim 64, further comprising:
a plurality of rail gussets coupled with the base plate, the inner plate base floor and the inner base side portions.

69. An earthquake resistant equipment rack comprising:
a rectangular base;
two vertical upright members coupled to and extending upward from the base; and
a top coupled to and extending between upper ends of the vertical upright members,
the top comprising two channels, each channel having a planar central portion and sides extending vertically from the planar central portion, the sides of one channel being in overlapping contact with the sides of the other channel.

70. The earthquake resistant equipment rack according to claim 69, wherein the top further comprises two stiffeners, each stiffener overlapping with one side of one channel and the corresponding side of the other channel.

71. An earthquake resistant equipment rack, comprising:
a rectangular base;
two vertical upright members coupled to and extending upwardly from the base; and
a top rail coupled to and extending between upper ends of the vertical upright members,
the base comprising: a floor; a back wall integrally formed with the floor; a front wall integrally formed with the floor; and four upstanding gussets integrally formed with the floor to provide structural rigidity to a coupling of the vertical upright member with the base, each gussets being positioned proximate a corner of the base, each gusset including a side portion extending upward from the floor, a horizontal portion extending horizontally inward from an upper end or the side portion; and an inside position extending vertically downward from the horizontal portion and being spaced apart from the side portion, wherein inside edges of the gusset side portion, the gusset horizontal portion and the gusset inside portion are coupled with adjacent portions of a vertical upright member.

72. An earthquake resistant equipment rack comprising:
a rectangular base;
two vertical upright member coupled to and extending upward from the base;
a top coupled to and extending between upper ends of the vertical upright members; and
a cover coupled to the base,
the base having a floor portion and a rear upwardly extending portion integral with the floor portion, the cover having a top portion and front and rear walls downwardly extending therefrom, the cover rear wall being spaced from the base rear wall.

73. The earthquake resistant equipment rack according to claim 72, wherein the base rear wall has a horizontally extending portion extending from an upper edge of the base rear well, the horizontally extending portion being coupled with the cover.

74. The earthquake resistant equipment rack according to claim 72, wherein the base has at least two upstanding gussets integrally formed with the floor portion to provide structural rigidity to the coupling of the vertical upright member with the base.

75. The earthquake resistant equipment rack according to claim 72, wherein the base cover includes side walls integrally formed with the base cover top, the side walls being coupled with the base floor, the gussets and the vertical upright members.

76. The earthquake resistant equipment rack according to claim 75, wherein each base cover side wall includes at least one access aperture therein.

77. An earthquake resistant equipment rack comprising:
a rectangular base;
two vertical upright members coupled to and extending upwardly from the base; and
a top rail coupled to and extending between upper ends of the vertical upright members, the top rail comprising: a top having a central plate, a front wall integrally formed with the central plate and extending downward from the central plate and a back wall integrally formed with the central plate, extending downward from the central plate and being spaced apart from the front wall; and at least one top channel having a flat central portion, a front wall integrally formed with the flat central portion and a back wall integrally formed with the flat central portion, the top channel front wall and top channel back wall being 90° to the flat central portion, one of the top channel walls being coupled with one of the top front wall and the top back wall, the other of the top channel walls being coupled with the top central plate.

78. The earthquake resistant equipment rack according to claim 77, wherein the number of top channels is two.

79. The earthquake resistant equipment rack according to claim 77, wherein a top channel is proximate the back wall of top and edges of the top channel are coupled to the vertical upright members.

80. The earthquake resistant equipment rack according to claim 77, wherein the top includes side panels integrally formed with the top central plate and coupled with the top walls.

81. The earthquake resistant equipment rack according to claim 80, wherein a top channel is proximate the front wall of the top and end edges of the top channel are coupled to the top side panels.

82. The earthquake resistant equipment rack according to claim 58, wherein at least two of the gusset side portion inside edge, the gusset horizontal portion inside edge and the gusset inside portion inside edge are coupled with adjacent portions of a vertical upright member.

83. The earthquake resistant equipment rack according to claim 58, wherein each gusset is J shaped, the J shape being upside down.

* * * * *